US012779767B2

(12) United States Patent
Iino

(10) Patent No.: US 12,779,767 B2
(45) Date of Patent: Nov. 3, 2026

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Satoshi Iino, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 291 days.

(21) Appl. No.: 18/329,714

(22) Filed: Jun. 6, 2023

(65) Prior Publication Data

US 2024/0017476 A1 Jan. 18, 2024

(30) Foreign Application Priority Data

Jul. 15, 2022 (JP) ................................ 2022-113699

(51) Int. Cl.
*B29C 59/00* (2006.01)
*B29C 33/42* (2006.01)
*B29C 59/02* (2006.01)
*G03F 7/00* (2006.01)

(52) U.S. Cl.
CPC .......... *B29C 59/002* (2013.01); *B29C 33/424* (2013.01); *B29C 59/022* (2013.01); *G03F 7/0002* (2013.01)

(58) Field of Classification Search
CPC ..................................................... G03F 7/0002
See application file for complete search history.

(56) References Cited

U.S. PATENT DOCUMENTS 6,092,031 A 7/2000 Yasuda
9,616,613 B2 * 4/2017 Suzuki .................. G03F 9/7038
10,315,344 B2 * 6/2019 Fujimoto .............. G03F 7/0002
(Continued)

FOREIGN PATENT DOCUMENTS

CN 104238263 * 12/2014 ........... G03F 7/0002
JP H10199784 A 7/1998
(Continued)

OTHER PUBLICATIONS

Office Action issued in Korean Appln. No. 10-2023-0088087 mailed Aug. 9, 2025.

*Primary Examiner* — Joseph S Del Sole
(74) *Attorney, Agent, or Firm* — ROSSI, KIMMS & McDOWELL LLP

(57) ABSTRACT

An imprint apparatus that forms a pattern on a substrate using a mold and an imprint material comprises a plurality of measurement units configured to measure a misalignment amount between the mold and the substrate by detecting a plurality of internal measurement marks disposed on the mold and the substrate, an alignment unit configured to perform alignment of the mold and the substrate based on the misalignment amount measured by the plurality of measurement units, and a correction unit configured to respectively acquire a measurement error of each of the plurality of measurement units based on a deviation amount between external measurement marks provided on the mold and the substrate, and correct the alignment by the alignment unit based on the measurement error of each of the plurality of measurement units.

13 Claims, 11 Drawing Sheets

1

(56) References Cited

U.S. PATENT DOCUMENTS

| | | | | |
|---|---|---|---|---|
| 2014/0346700 | A1* | 11/2014 | Sato | G03F 9/7088 425/169 |
| 2019/0033708 | A1* | 1/2019 | Cherala | G03F 9/7073 |
| 2022/0342299 | A1* | 10/2022 | Nakamura | G03F 7/0002 |

FOREIGN PATENT DOCUMENTS

| | | | | |
|---|---|---|---|---|
| JP | 2015002344 | A | 1/2015 | |
| JP | 2017157639 | * | 9/2017 | B05D 3/12 |
| KR | 1020110126042 | A | 11/2011 | |
| KR | 1020130008464 | A | 1/2013 | |
| KR | 1020140139428 | A | 12/2014 | |
| KR | 1020150135175 | A | 12/2015 | |
| KR | 1020160107324 | A | 9/2016 | |

* cited by examiner

FIG. 6

| MEASUREMENT UNIT | 15A | 15B | 15C | 15D |
|---|---|---|---|---|
| CORRECTION VALUE | a | b | c | d |

FIG. 10

| MEASUREMENT UNIT | | 15A | 15B | 15C | 15D |
|---|---|---|---|---|---|
| SHOT REGION α | MARK POSITION | 1 | 3 | 7 | 9 |
| | CORRECTION VALUE | α a1 | α b3 | α c7 | α d9 |
| SHOT REGION β | MARK POSITION | 2 | 3 | 5 | 6 |
| | CORRECTION VALUE | β a2 | β b3 | β c5 | β d6 |
| SHOT REGION γ | MARK POSITION | 1 | 2 | 4 | 5 |
| | CORRECTION VALUE | γ a1 | γ b2 | γ c4 | γ d5 |

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method for manufacturing an article capable of improving alignment accuracy.

Description of the Related Art

In the manufacturing process of semiconductors, alignment is performed between patterns drawn on each of a mold and a substrate in an exposure apparatus. However, despite performing the alignment, a deviation amount between the patterns occurs. To compensate for this misalignment amount, there is a common method of detecting the deviation amount by an external overlay measurement device and applying the measured amount to the exposure apparatus as an overlay correction value.

Japanese Patent Laid Open No. H10-199784 describes a method of properly performing alignment of a mold and a substrate by determining a next overlay correction value based on overlay correction values obtained from a plurality of types of processes and past trends of measurement values of an external overlay measurement device.

However, in an imprint apparatus, die-by-die alignment, in which alignment of a mold and a substrate is performed in each shot region, is generally employed as a method of overlay. Typically, alignment of the mold and the substrate is performed based on the misalignment amount between the mold and the substrate, which is measured by a plurality of measurement units in the apparatus.

A measurement unit in an apparatus has a measurement error due to a mechanical factor or the like, and the amount and the way of change of the measurement error thereof are not constant, and may vary from one measurement unit to another. Furthermore, as a result of the measurement errors of all the measurement units being combined, it is possible to detect the measurement errors with an external overlay measurement device. However, it is difficult to quantify the measurement error of each individual measurement unit. If an appropriate correction value can be set for each measurement unit based on the tendency of measurement errors of the quantified measurement units, correction of a valid overlay correction error becomes possible.

SUMMARY OF THE INVENTION

One aspect of the present invention is an imprint apparatus configured to form a pattern on a substrate by using a mold and an imprint material, the imprint apparatus comprising at least one processor or circuit configured to function as:

a plurality of measurement units configured to measure a misalignment amount between the mold and the substrate by detecting a plurality of internal measurement marks disposed on the mold and the substrate, an alignment unit configured to perform alignment of the mold and the substrate based on the misalignment amount measured by the plurality of measurement units, and a correction unit configured to respectively acquire a measurement error of each of the plurality of measurement units based on a deviation amount between external measurement marks provided on the mold and the substrate, and correct the alignment by the alignment unit based on the measurement error of each of the plurality of measurement units.

Further features of the present invention will become apparent from the following description of embodiments with reference to the attached drawings.

BRIEF DESCRIPTION OF THE DRAWINGS

FIG. 6 is a diagram showing a state in which each measurement unit has a correction value.

FIG. 10 is a diagram showing a state of having a correction value of a measurement unit for each shot region and for each mark position.

DESCRIPTION OF THE EMBODIMENTS

First Embodiment

Hereinafter, with reference to the accompanying drawings, favorable modes of the present invention will be described using embodiments. In each diagram, the same reference signs are applied to the same members or elements, and duplicate description will be omitted or simplified.

Figure 1:
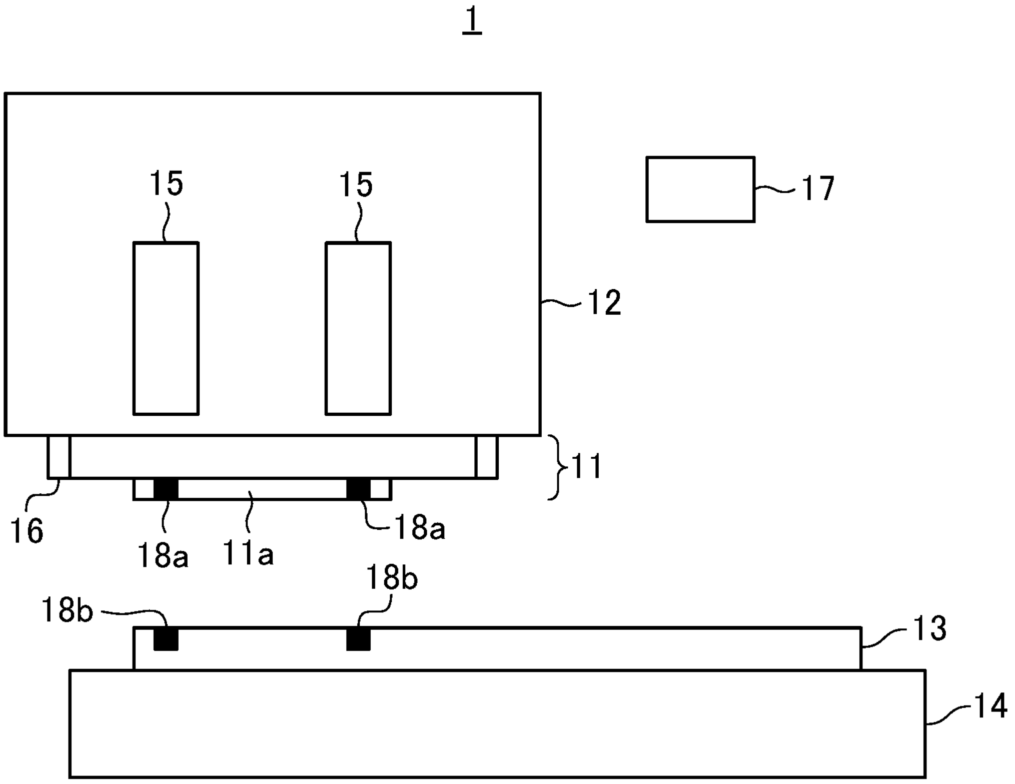
FIG. 1 is a schematic diagram showing a configuration of an imprint apparatus 1 according to a first embodiment of the present invention.

FIG. 1 is a schematic diagram showing a configuration of an imprint apparatus 1 according to a first embodiment of the present invention. An imprint apparatus 1 is a lithography apparatus configured to press a mold onto an imprint material on a substrate so as to form a pattern on the surface of the imprint material. In the present embodiment, a resin is used as the imprint material, and a photo-curing method of curing the resin by irradiation of ultraviolet light is employed as a resin curing method.

The imprint apparatus 1 includes a mold holding unit 12 that holds a mold 11, a substrate holding unit 14 that holds a substrate 13, measurement units 15, a shape correction unit 16, and a control unit 17. The imprint apparatus 1 also includes a resin supply unit that includes a dispenser configured to supply the resin onto the substrate, a bridge plate configured to hold the mold holding unit 12, and a base plate configured to hold the substrate holding unit 14.

The mold 11 has a rectangular exterior shape, and includes a pattern surface 11*a* on which a pattern (concave-convex pattern) to be transferred to the (resin on) the substrate 13 is formed. The mold 11 is configured by a material that ultraviolet light for curing the resin on the substrate can penetrate, such as quartz, for example. In addition, mold-side internal measurement marks 18*a* are formed on the pattern surface 11*a* of the mold 11.

The mold holding unit 12 is a holding mechanism that holds the mold 11. The mold holding unit 12 includes, for example, a mold chuck that vacuum-adsorbs or electrostatically adsorbs the mold 11, a mold stage on which the mold chuck is placed, and a driving system that moves the mold stage.

Such a driving system drives the mold stage (that is, the mold 11) in at least a Z-axis direction (the pressing direction when the mold 11 is pressed on the resin on the substrate). In addition, such a driving system may be provided with a function of driving the mold stage not only in the Z-axis direction, but also in an X-axis direction, a Y-axis direction, and a θ direction (rotation around the Z-axis).

The substrate 13 is a substrate onto which the pattern of the mold 11 is transferred and includes, for example, a single-crystal silicon substrate or Silicon on Insulator (SOI) substrate. The resin is supplied (applied) onto the substrate 13 from the resin supply unit. Furthermore, substrate-side internal measurement marks 18*b* are formed in each of a plurality of shot regions of the substrate 13.

Thus, a plurality of internal measurement marks 18*a* and 18*b* are respectively formed on the mold and substrate in the imprinting device for use in alignment by measuring a misalignment of the mold and substrate during imprinting. It should be noted that a plurality of external measurement marks 19*a* and 19*b* are respectively formed near the plurality of internal measurement marks 18*a* and 18*b* of the mold and the substrate.

It should be noted that the external measurement marks 19*a* and 19*b* are marks for detecting the misalignment amount between the pattern of the substrate after imprinting and the mold by an external overlay measurement device (hereinafter, an "external measurement device".). Further note that an imprint system is configured by the imprint apparatus 1 and an external measurement device, which is different from the imprint apparatus and performs an overlay measurement operation by using the external measurement marks on the substrate.

The substrate holding unit 14 includes, for example, a substrate chuck that vacuum-adsorbs or electrostatically adsorbs the substrate 13, and a driving system. Such a driving system drives the substrate stage (that is, the substrate 13) at least in the X-axis direction and the Y-axis direction (directions orthogonal to the pressing direction of the mold 11). In addition, such a driving system may be provided with a function of driving the substrate stage not only in the X-axis direction and the Y-axis direction, but also in the Z-axis direction and the θ (rotation around the Z-axis) direction.

A measurement unit 15 includes a scope that optically detects (observes) the mold-side internal measurement marks 18*a* provided on the mold 11, and the substrate-side internal measurement marks 18*b* provided on each of the plurality of shot regions of the substrate 13.

A measurement unit 15 measures the relative positions (misalignment) of the mold 11 and the substrate 13 based on the detection result of the scope. The present embodiment includes a plurality of measurement units 15 that measure the amount of misalignment between the mold and the substrate by detecting a plurality of internal measurement marks 18 that are disposed on the mold and the substrate 13.

It should be noted that a measurement unit 15 may include, for example, a scope that detects a signal reflecting a relative positional relationship such as an interference signal of two marks or moiré in order to detect the relative positional relationship between the mold-side internal measurement marks 18*a* and the substrate side internal measurement marks 18*b*.

The shape correction unit 16 corrects a difference in shape between the pattern of the mold 11 and the shot region of the substrate 13 for each shot region of the substrate 13. In the present embodiment, the shape correction unit 16 corrects the shape of the pattern surface 11*a* by deforming the mold 11 (the pattern surface 11*a*) by applying a force to the mold 11 in a direction parallel to the pattern surface 11*a*. The shape correction unit 16 may deform the pattern surface 11*a* by controlling the temperature of the mold 11 by applying heat to the mold 11.

In addition, instead of deforming the pattern surface 11*a* of the mold 11, thermal expansion of the substrate 13 may be performed locally by irradiating a predetermined position on the substrate 13 with light having a fixed intensity, and correcting the shape of the shot region (a pattern formed on the substrate 13). In this case, the imprint apparatus 1 is provided with a heat supply unit for supplying heat to the mold 11 or the substrate 13 as a shape correction unit.

The control unit 17 includes a CPU, a memory, and the like, and controls the entire imprint apparatus 1 (each unit of the imprint apparatus 1) by executing a computer program stored in the memory by the CPU acting as a computer. In the present embodiment, the control unit 17 controls an imprint process and processing related to the imprint process.

For example, when performing the imprint process, the control unit 17 performs alignment of the mold 11 and the substrate 13 based on the measurement results that were measured in a measurement unit 15 (misalignment).

In addition, when performing the imprint process, the control unit 17 calculates and controls the deformation amount of the pattern surface 11*a* of the mold 11 by the shape correction unit 16, and the heat supplied to the mold 11 or the substrate 13.

Figure 2:
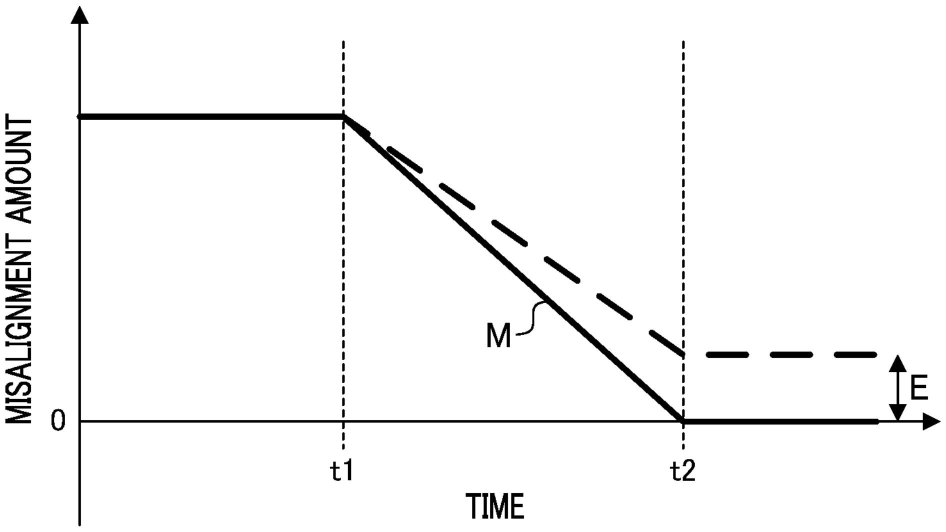
FIG. 2 is a diagram showing a state in which a measurement value of a measurement unit changes due to alignment.

FIG. 2 is a diagram that shows a state in which a measurement value of a measurement unit changes due to alignment. FIG. 2 shows a state in which, during imprinting, the measurement value 18*d* of a measurement unit 15, that is, the misalignment amount of the mold 11 and the substrate 13, decreases with time due to the alignment by driving the shape correction unit 16 and the substrate holding unit 14.

From time t1, an alignment of the mold 11 and substrate 13 begins, and at time t2, an apparent measurement value M of a measurement unit 15 always converges to near zero, but there is a possibility that the actual tracking position may be misaligned due to mechanical errors and the like. This is made the true measurement error E of the measurement unit. It should be noted that at time t2, because the resin that has been applied between the mold and the substrate is cured by ultraviolet irradiation, the true measurement error E remains as an alignment error in the pattern after the transfer.

The imprint apparatus 1 cannot know the true measurement error E. In addition, the true measurement error E may not be fixed and can change at any time. Although the quantification of the true measurement error E is difficult, in the present embodiment, a measurement error E1 as a value close to the true measurement error is quantified by the method described below. Thereby, by determining the correction value of a measurement unit by taking into account the change tendency of the correction value, the constantly changing true measurement error E of the measurement unit can be effectively corrected.

Figure 3A:
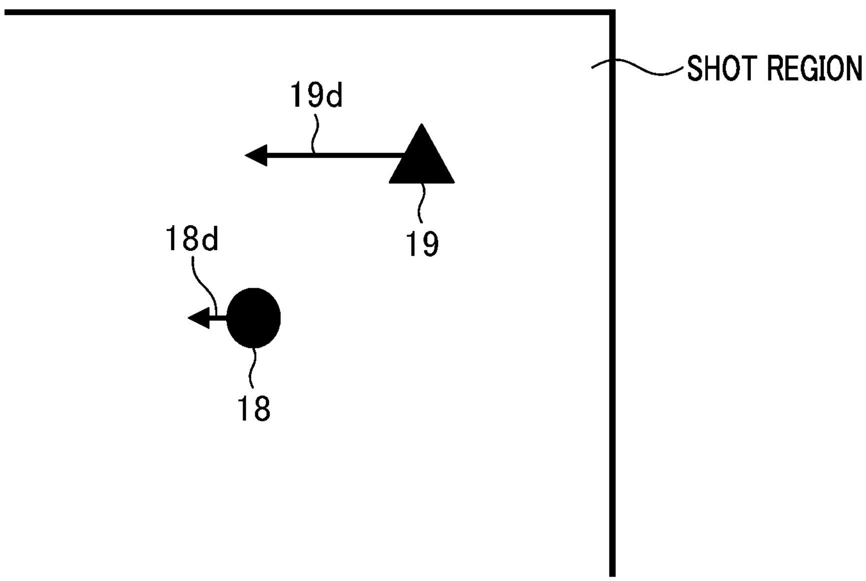
FIG. 3A and FIG. 3B are diagrams showing a state in which a measurement error E1 of a measurement unit is quantified by a measurement value of an external overlay measurement device.
Figure 3B:
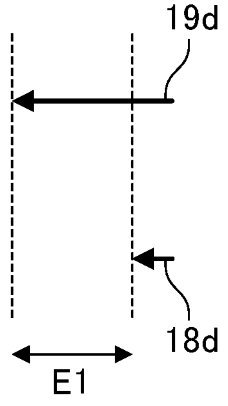

FIGS. 3A and 3B are diagrams showing a state in which the measurement error E1 of a measurement unit is quantified by a measurement value of an external measurement device. FIG. 3A shows a state in which internal measurement marks 18 and external measurement marks 19 are disposed in a shot region.

Here, the internal measurement marks 18*a* of the mold side and the internal measurement marks 18*b* of the substrate side are collectively referred to as the internal measurement marks 18. Similarly, external measurement marks 19*a* and 19*b* that are disposed on each of the mold and the substrate are collectively referred to as the external measurement marks 19. Because a measurement value 18*d* of a measurement unit (the misalignment amount of FIG. 2) is the measurement value of the measurement unit 15 at time t2 of FIG. 2, it has become a value near zero.

A measurement value 19*d* of an external measurement device is a value obtained by measuring the overlay amount of the mold 11 and the substrate 13 by an external measurement device after the imprint process. In the present embodiment, as shown in FIG. 3B, the measurement value 19*d* for external measurement is made an absolute reference, and the difference between the measurement value 18*d* of a measurement unit is made the measurement error E1 of the measurement unit.

The internal measurement marks 18 and the external measurement marks 19 are preferably close to each other, and the closer the distance, the smaller the difference between the true measurement error E and the measurement error E1 of a measurement unit. Accordingly, in the present embodiment, the measurement error of each of the plurality of measurement units is acquired by using the external measurement marks that are closest to the internal measurement marks.

Although the distance between the internal measurement marks 18 and the external measurement marks 19 is preferably shorter, as the distance between both marks becomes shorter, it is possible to reduce the effect of distortion of the mold caused by variations in the imprinting operation when calculating the measurement error E1 of a measurement unit. The distance between both marks is preferably disposed in the extreme vicinity of a few hundred μm.

It should be noted that the variation of the imprinting operation refers to factors such as the pressing pressure and tilt of the mold 11 when it is pressed against the substrate 13, and it is known that the shape of the mold is distorted by these changes. Mechanical errors may result in a fixed amount of variation of the imprinting operation, and the resulting distortion of the mold.

In addition, because the overlay correction value that is input to the imprint apparatus 1 is not fixed, the measurement error E1 of a measurement unit changes according to the overlay correction value. Here, the overlay correction value is a translation, a magnification, or a rotation component or the like that is applied to the driving of the shape correction unit 16 and the substrate holding unit 14 based on the measurement value 19*d* of an external measurement device.

Figure 4A:
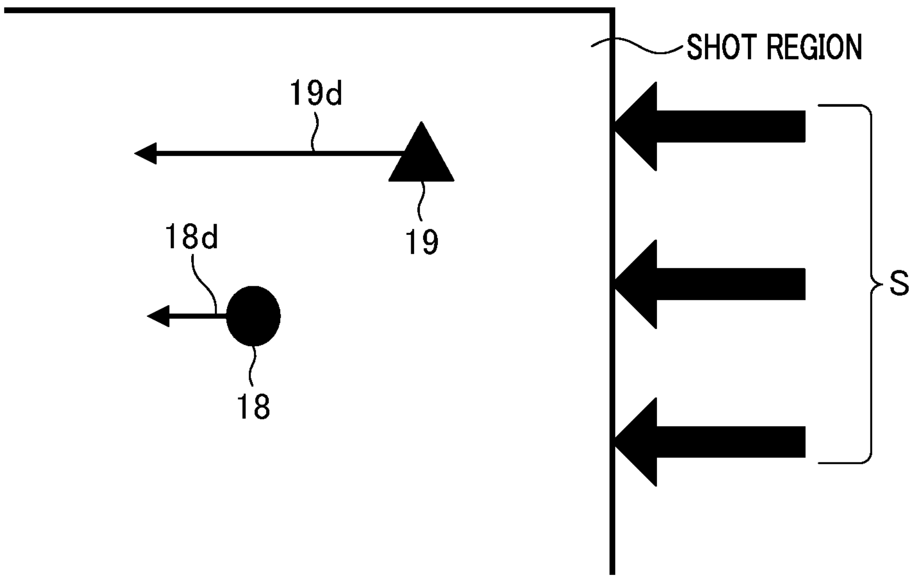
FIG. 4A and FIG. 4B are diagrams explaining a state in which the measurement error E1 changes due to a change in the magnification correction amount that is input to a shape correction unit 16.
Figure 4B:
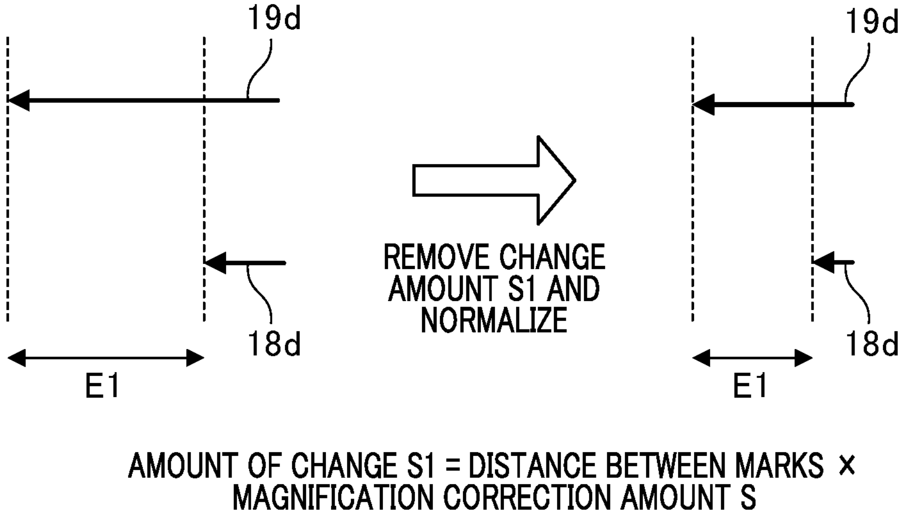

FIG. 4A and FIG. 4B are diagrams explaining a state in which the measurement error E1 changes due to a change in the magnification correction amount that is input to the shape correction unit 16. When a magnification correction amount S is applied, the deformation amount of the mold increases linearly toward the outer periphery of the shot region.

In the example of FIG. 4A, for the internal measurement marks 18 and the external measurement marks 19, the deformation amount of the mold at the position of the external measurement marks 19 near the periphery of the shot region becomes larger than the deformation amount of the position of the internal measurement marks 18.

As a result, as shown on the left side of FIG. 4B, the measurement error E1 of a measurement unit, which is the difference between the measurement value 18*d* of a measurement unit and the measurement value 19*d* of an external measurement device, changes from the value in a state in which the magnification correction amount S is not present. Thus, it is not always possible to evaluate the measurement error E1 on the same scale in a case in which there is no magnification correction amount S and in a case in which there is a magnification correction amount S.

Thereby, in the present embodiment, the change in the measurement error due to the magnification correction amount S1 is obtained by multiplying the magnification correction amount S by the distance between the internal measurement marks 18 and the external measurement marks 19 in the shot region and the magnification correction amount S. Then, normalization is performed by removing the change amount S1 from the measurement error E1 in a state in which the magnification correction amount S has been applied.

That is, in the present embodiment, a measurement error is calculated for each of the plurality of measurement units based on the distance between the internal measurement marks and the external measurement marks, and the deformation amount of the mold by the shape correction unit.

Because the measurement error E1 after normalization becomes the same as in a state in which there is no magnification correction amount S, the measurement error E1 can always be evaluated on the same scale. It should be noted that, here, although magnification has been given by way of example, normalization is also performed similarly on a rotation component, a rhombus component, a trapezoidal component, and the like.

Further, in the present embodiment, by accumulating the normalized measurement error E1 of a measurement unit for a certain period of time and determining the correction value of a measurement unit 15 based on the tendency thereof, the measurement error E1 of the measurement unit, and thus the true measurement error E, is effectively corrected. That is, in the present embodiment, the alignment by the alignment unit is corrected based on a result of accumulating the measurement error for each measurement unit for a predetermined period of time (for example, a tendency of past changes).

Figure 5A:
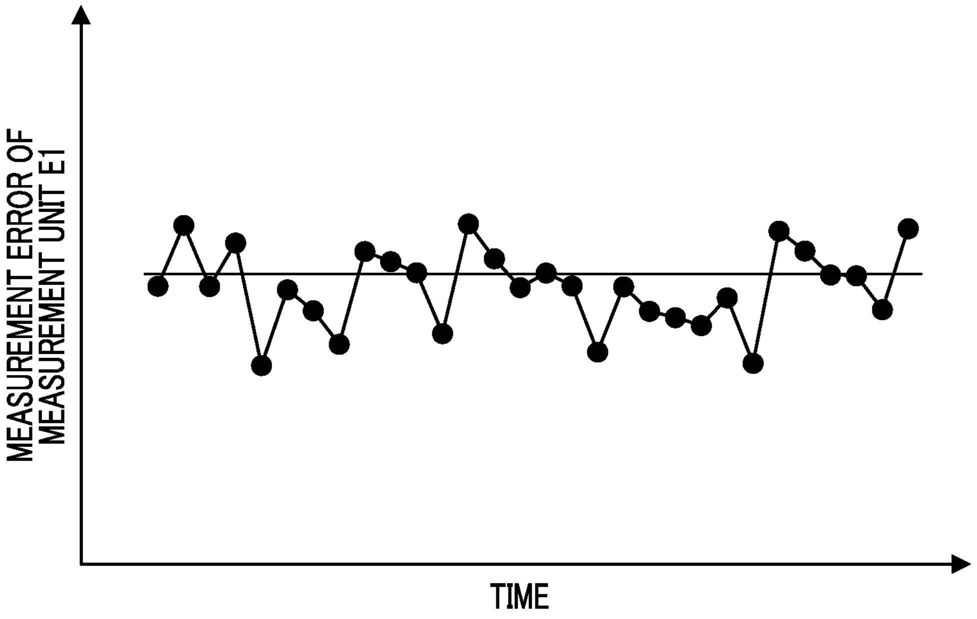
FIG. 5A and FIG. 5B are diagrams showing a past tendency of measurement errors.
Figure 5B:
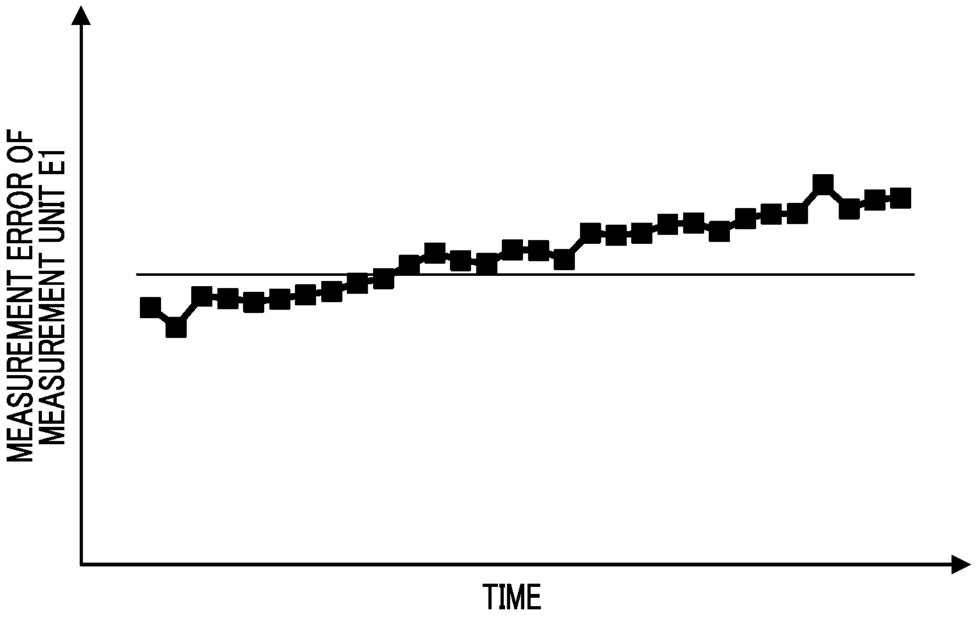

FIG. 5A and FIG. 5B are diagrams showing the past tendency of measurement errors, and FIG. 5A shows a case in which, by way of example, the measurement error E1 of a measurement unit is varied as a past tendency. In a case in which the tendency has a variation, the most probable value generated in a measurement unit 15 at the next imprint is considered to be, for example, an average value of the accumulated past data.

In contrast, FIG. 5B shows, as another example, a case in which the measurement error E1 of a measurement unit has a drift (such as an increasing tendency or a decreasing tendency) as a past tendency.

In a case in which the tendency is drift, a value that has a high probability of being generated in a measurement unit 15 at the next imprint is considered to be a predicted value calculated from, for example, the most recent value of the accumulated past data or a curve of a past drift.

Thus, the correction value of a measurement unit 15 can be effectively determined by changing the prediction method of the measurement error that is generated in the measurement unit at the next imprint time according to the past tendency of the measurement error E1 of a normalized measurement unit.

It should be noted that, the manner in which past tendency is captured is not limited to variations and drift. A method of statistically predicting a value that has the highest probability of occurring as a measurement error in a measurement unit 15 at the time of a next imprint based on the accumulated data of past measurement errors E1 may be used.

Typically, the imprint apparatus 1 has a plurality of measurement units 15. Therefore, it is possible to achieve effective overlay error reduction for the entire apparatus by determining the appropriate correction value for each measurement unit based on the past tendency of the measurement error E1 in each measurement unit. In this case, as shown in FIG. 6, in a case in which the imprint apparatus 1 has a plurality (four) of measurement units 15*a* to 15*d*, the correction values a to d are set for each measurement unit. FIG. 6 is a diagram showing a state in which each measurement unit has a correction value.

In addition, in a case in which the imprint apparatus 1 has a plurality of measurement units, it is possible to predict a measurement error E1 of a measurement unit and to determine the correction value of a measurement unit by comprehensively referring to the tendency of the measurement error E1 of the plurality of measurement units.

Figure 7:
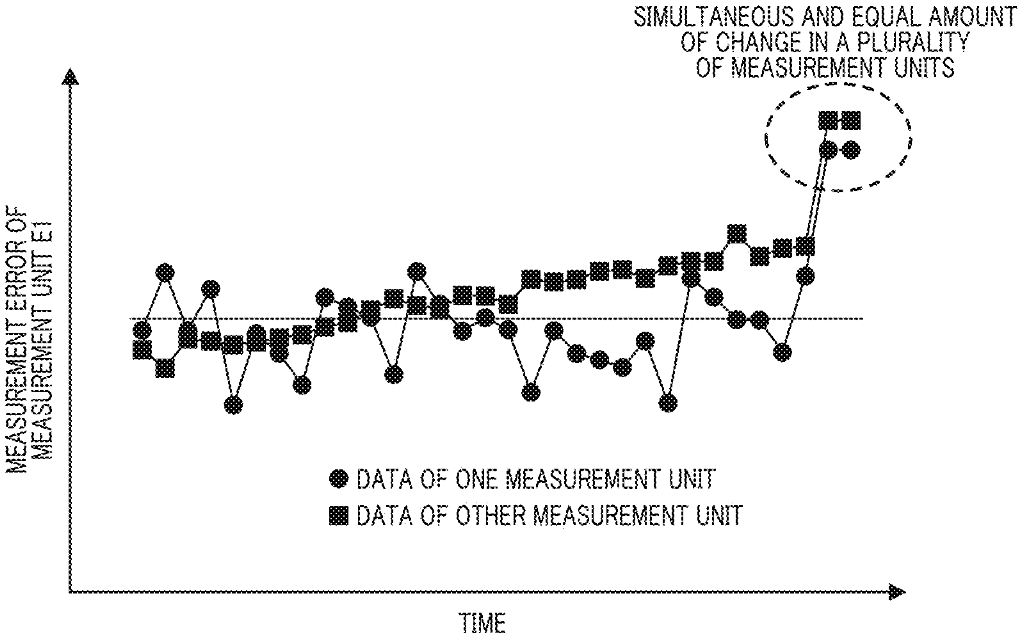
FIG. 7 is a diagram showing an example in which measurement errors of a plurality of measurement units change simultaneously.

For example, as shown in FIG. 7, in a case in which a change of the measurement error E1 that is simultaneous and of the same amount has been observed in a plurality of measurement units due to external factors and the like, it is possible to determine that the change that has occurred should be corrected, and to correct the change at the next imprint. FIG. 7 is a diagram showing an example in which measurement errors of a plurality of measurement units change simultaneously.

It is known that a measurement error E1 of a measurement unit varies depending on the position of the shot region on the substrate, and the position in the imprint view angle. As a cause of this, differences in the depth or distribution of patterns already formed on the substrate 13 depending on their position within the substrate 13 can be cited.

Thus, it is possible to increase the degree of freedom of correction by having a correction value for as many combinations of measurement units 15, and the shot position to be imprinted and the position of the internal measurement marks 18 at the imprint view angle.

Figure 8:
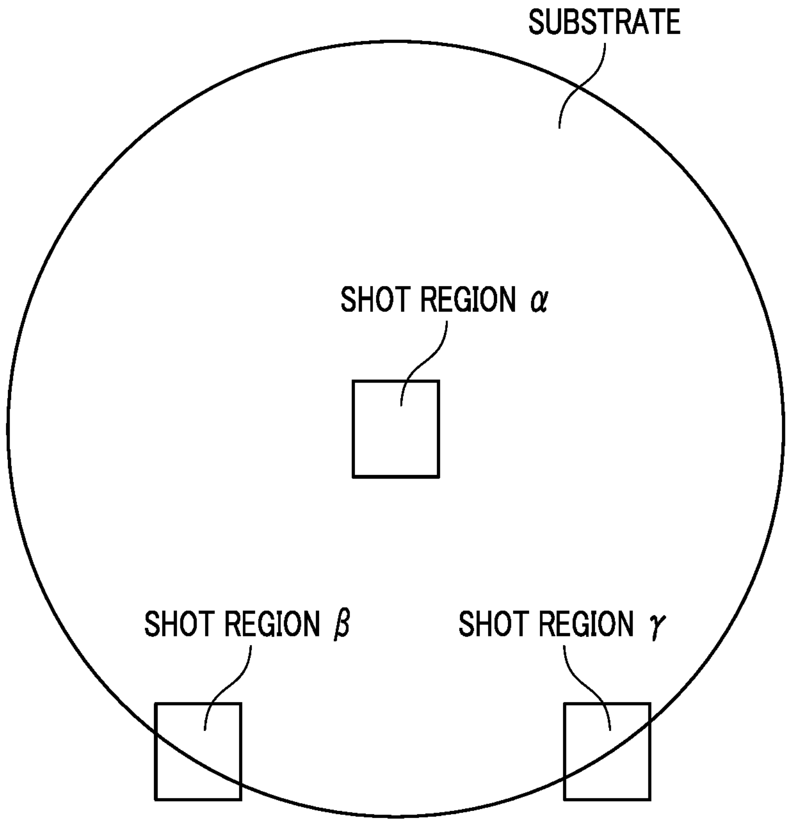
FIG. 8 is a diagram showing an example of the position of shot regions on a substrate.
Figure 9A:
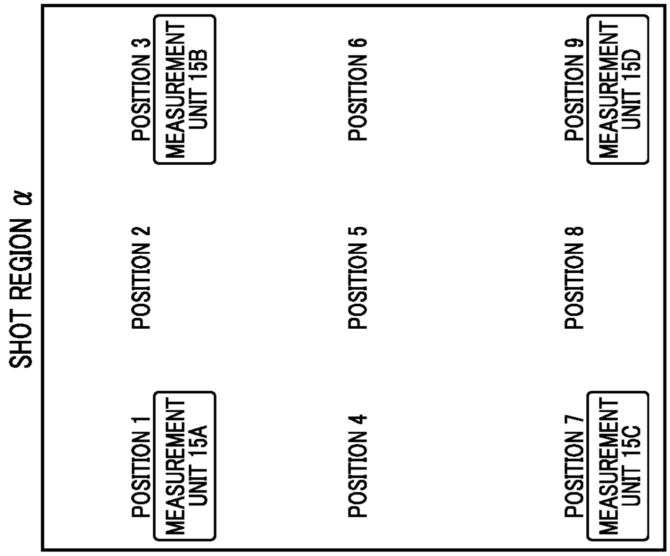
FIGS. 9A to 9C are diagrams showing a state in which measurement units and marks used differ depending on the shot region.
Figure 9B:
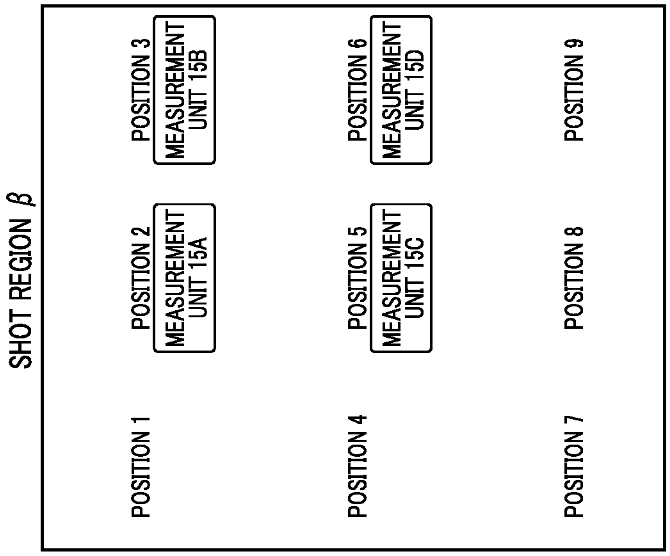
Figure 9C:
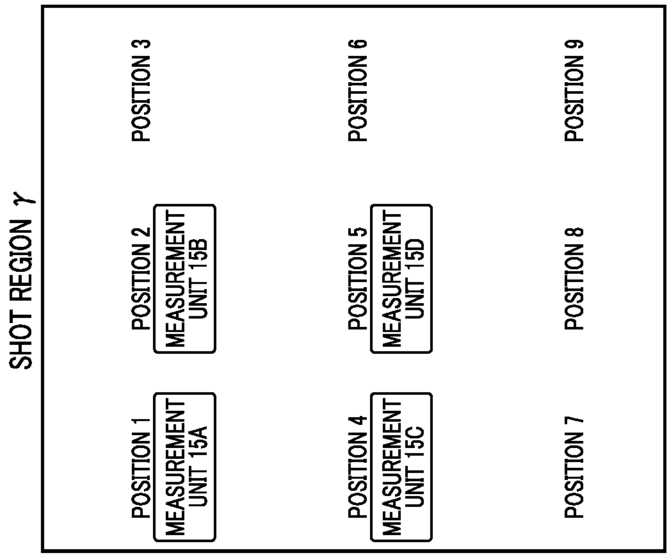

FIG. 8 is a diagram showing an example of the position of shot regions on a substrate, and FIGS. 9A to 9C are diagrams showing a state in which measurement units and corresponding marks are different depending on the shot region. In FIG. 8, there are shot regions α, β, and γ on the substrate 13 to be imprinted. In these shot regions, as shown in FIG. 9A to 9C, the positions of the internal measurement marks 18 that are respectively measured by the measurement units 15*a* to 15*d* are different.

FIG. 10 is a diagram showing a state of having a correction value of a measurement unit in each shot region and in each mark position, and as shown in FIG. 10, in each of the shot regions α to γ, a state of having a correction value is shown for each combination of mark position and measurement unit. Thus, in the present embodiment, the combination of a measurement unit and an internal measurement mark that is used for alignment is changed according to the position of the shot region.

Figure 11:
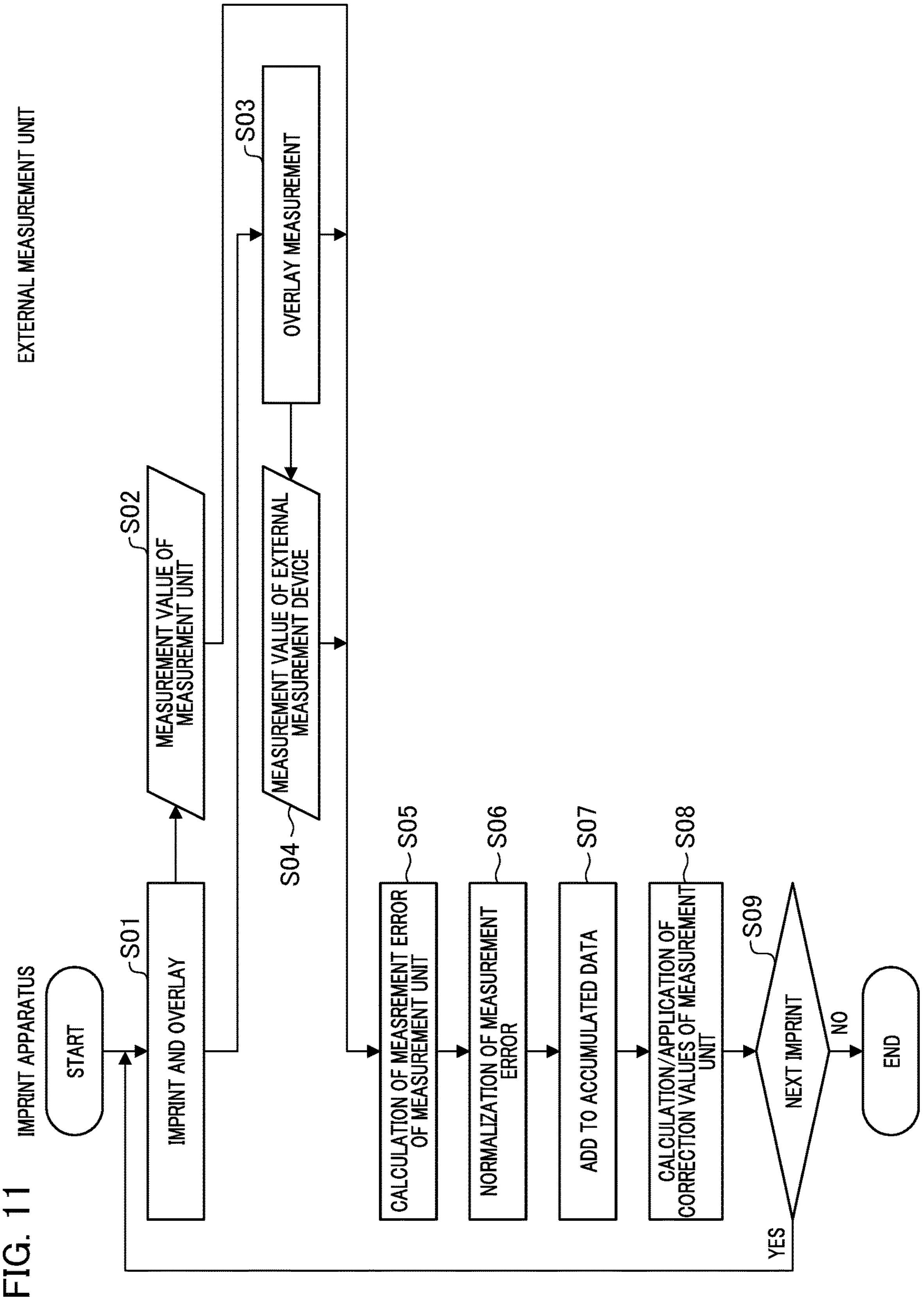
FIG. 11 is a flowchart in the First Embodiment.

FIG. 11 is a flowchart in the First Embodiment, and it explains the imprint method of the First embodiment. It should be noted that the operation of each step of the flow chart of FIG. 11 is performed by executing a computer program stored in a memory as a storage medium by a CPU as a computer provided in each of the control unit 17 and an external measurement device.

In step S01, the imprint apparatus 1 presses the mold 11 onto the substrate 13 via a resin, and performs the imprint process. At this time, a measurement unit 15 measures the misalignment amount between the internal measurement marks 18*a* on the mold side and the internal measurement marks 18*b* on the substrate side, and the shape correction unit 16 performs alignment (overlay) while correcting a magnification of the mold.

At this time, step S01 functions as a measurement step for measuring the misalignment amount between the mold and the substrate by using a plurality of measurement units 15 to detect internal measurement marks disposed on the mold and the substrate.

Further, step S01 also functions as a shape correction step or an alignment step in which the mold and substrate are aligned by causing the mold to deform based on the misalignment amount measured by the plurality of measurement units.

Further, at this time, the control unit 17 functions as an alignment unit. Here, an alignment unit includes a shape correction unit. It should be noted that alignment includes not only magnification correction, but also alignment by movement of the substrate. Next, in step S02, the control unit 17 acquires the measurement value 18*d* (the misalignment amount) of a measurement unit at the time of completion of the overlay and stores the measurement value 18*d* in the memory of the control unit 17.

At step S03, the CPU of an external measurement device performs an overlay measurement operation by using the external measurement marks on the substrate that has undergone imprint processing, and acquires a measurement value 19*d* of the external measurement device. At step S04, the measurement value 19*d* of the external measurement device is input to the imprint apparatus 1 and stored by the memory in the control unit 17.

At step S05, the control unit 17 calculates the measurement error E1 of a measurement unit by taking the difference between the measurement value 18*d* of the measurement unit that has been stored in the memory and the measurement value 19*d* of the external measurement device.

At step S06, the control unit 17 obtains a change amount S1 of the measurement error by multiplying an overlay correction value, such as the magnification correction value that was applied during the imprint process of step S01, by the distance between the internal measurement marks 18 and the external measurement marks 19. That is, as explained in FIG. 4, the normalization of the measurement error E1 is performed by removing the change amount S1 from the measurement error E1.

Furthermore, at step S07, the control unit 17 adds the data of the normalized measurement error E1 to the accumulated data. Then, at step S08, the control unit 17 predicts for each measurement unit, a measurement error generated at the next imprint in accordance with the past tendency of the measurement error E1 accumulated for a predetermined period of time, calculates a correction value for each measurement unit, and applies the correction value to each of the measurement units 15.

Here, step S03 to step S07 function as a correction step. In the correction step, a measurement error of each of the plurality of measuring units is acquired based on the deviation amount of external measurement marks provided on the mold and substrate and the deformation amount of the mold due to the shape correction step, and the alignment by the alignment step is corrected based on the measurement errors for each of the plurality of measurement units.

Furthermore, at this time, the control unit 17 functions as a correction unit. If there is a next imprint, the process is returned to step S01; otherwise, the flow of FIG. 11 ends.

Through the above-described method, by quantifying and normalizing the measurement error E1 as a value close to the true measurement error E, it is possible to always capture the change tendency of the measurement error E1 on the same scale. Further, by determining the correction value of a measurement unit according to the past change tendency of the measurement error E1, it is possible to perform effective and accurate correction of the overlay correction error between the mold and the substrate.

Second Embodiment

It should be noted that, as shown in FIG. 7, in a case in which an external factor that correlates with the past tendency of the measurement error E1 of a measurement unit is identified, a measurement error E1 of the measurement unit may be predicted from the change of the external factor, and a correction value of the measurement unit may be applied. That is, it is possible to correct the alignment by the alignment unit based on the past tendency of the change of the measurement error of the entire plurality of measurement units accumulated for a predetermined period of time.

Here, an external factor is, for example, an atmospheric pressure change, and in a case in which the correlation with atmospheric pressure is clear, it is possible to correct the change in the measurement error E1 of a measurement unit according to a forecast of the atmospheric pressure or the output of an atmospheric pressure meter. That is, it is possible to correct the measurement error E of the measurement unit in accordance with atmospheric pressure, and the alignment by the alignment unit may be corrected in accordance with an atmospheric pressure change.

Next, a method of manufacturing an article (a semiconductor IC element, a liquid crystal display element, MEMS, or the like) using the above-described mold will be explained. An article is manufactured by executing a processing process of processing the substrate (a step of manufacturing an article from the imprinted substrate) after a process of imprinting the substrate on which the imprint material is applied by using the above-described mold and a process of releasing the mold from the imprint material.

The post-processing process includes etching, resist peeling, dicing, bonding, packaging, and the like. According to the article manufacturing method using the present invention, since performing alignment of the mold and shot region with high precision is possible, the yield is improved and it is possible to manufacture an article of higher quality.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the imprint apparatus through a network or various storage media. Then, a computer (or a CPU, an MPU, or the like) of the imprint apparatus may be configured to read and execute the program. In such a case, the program and the storage medium storing the program configure the present invention.

This application claims the benefit of Japanese Patent Application No. 2022-113699, filed on Jul. 15, 2022, which is hereby incorporated by reference herein in its entirety.

What is claimed is:

1. An imprint apparatus configured to form a pattern on a substrate by using a mold and an imprint material, the imprint apparatus comprising:

a plurality of measurement units configured to measure a misalignment amount between the mold and the substrate by detecting a plurality of internal measurement marks disposed on the mold and the substrate;

an alignment unit configured to perform alignment of the mold and the substrate based on the misalignment amount measured by the plurality of measurement units; and at least one processor or circuit configured to function as a correction unit configured to, after the pattern has been formed on the substrate, respectively acquire a measurement error of each of the plurality of measurement units based on a deviation amount between external measurement marks (i) provided on the mold and the substrate and (ii) being different marks than the internal measurement marks detected by the plurality of measurement units, and correct the alignment by the alignment unit based on the measurement error of each of the plurality of measurement units.

2. The imprint apparatus according to claim 1, wherein the alignment unit includes a substrate stage configured to change the position of the substrate based on the misalignment amount between the mold and the substrate.

3. The imprint apparatus according to claim 1, wherein the alignment unit includes a shape correction unit configured to deform the mold based on the misalignment amount between the mold and the substrate.

4. The imprint apparatus according to claim 3, wherein the correction unit respectively acquires the measurement error of each of the plurality of measurement units based on the deformation amount of the mold by the shape correction unit.

5. The imprint apparatus according to claim 4, wherein the correction unit respectively calculates the measurement error of each of the plurality of measurement units based on a distance between the internal measurement marks and the external measurement marks, and the deformation amount of the mold by the shape correction unit.

6. The imprint apparatus according to claim 4, wherein the correction unit acquires the measurement error of each of the plurality of measurement units by using the external measurement marks nearest to the internal measurement marks.

7. The imprint apparatus according to claim 1, wherein the correction unit corrects the alignment by the alignment unit based on the measurement error result of each of the measurement units that has been accumulated for a predetermined period of time.

8. The imprint apparatus according to claim 1, wherein the correction unit corrects the alignment by the alignment unit based on a past change tendency of the measurement error of each of the measurement units that has been accumulated for a predetermined period of time.

9. The imprint apparatus according to claim 1, wherein the correction unit corrects the alignment by the alignment unit based on a past change tendency of the measurement error of an entirety of the measurement units that has been accumulated for a predetermined period of time.

10. The imprint apparatus according to claim 1, wherein the correction unit corrects the alignment by the alignment unit in accordance with an atmospheric pressure change.

11. The imprint apparatus according to claim 1, wherein the correction unit changes a combination of an internal measurement unit and the measurement marks used for the alignment in accordance with the position of a shot region.

12. An imprint apparatus configured to form a pattern on a substrate by using a mold and an imprint material, the imprint apparatus comprising:

measurement units configured to measure a misalignment amount between the mold and the substrate by detecting internal measurement marks disposed on the mold and the substrate;

a shape correction unit configured to deform the mold so as to align the mold with the substrate based on the misalignment amount that was measured by the measurement units; and at least one processor or circuit configured to function as a correction unit configured to, after the pattern has been formed on the substrate, acquire a measurement error of the measurement units based on a deviation amount between external measurement marks (i) provided on the mold and the substrate and (ii) being different marks than the internal measurement marks detected by the plurality of measurement units, and (iii) a deformation amount of the mold by the shape correction unit, and to correct an alignment by the shape correction unit based on the measurement error of the measurement units.

13. The imprint apparatus according to claim 1, wherein the correction unit is configured to respectively acquire the measurement error of each of the plurality of measurement units based on the deviation amount between the external measurement marks that are disposed on the mold and the substrate and that are spaced apart from the plurality of internal measurement marks disposed on the mold and the substrate.

* * * * *